(12) United States Patent
Blackburn et al.

(10) Patent No.: US 10,856,432 B1
(45) Date of Patent: Dec. 1, 2020

(54) SOCKET CONNECTOR AND CABLE ASSEMBLY FOR A COMMUNICATION SYSTEM

(71) Applicant: TE CONNECTIVITY SERVICES GMBH, Schaffhausen (CH)

(72) Inventors: Christopher William Blackburn, Bothell, WA (US); Matthew Ryan Schmitt, Middletown, PA (US); Lucas A. Benson, Camp Hill, PA (US)

(73) Assignee: TE CONNECTIVITY SERVICES GmbH, Schaffhausen (CH)

( * ) Notice: Subject to any disclaimer, the term of this patent is extended or adjusted under 35 U.S.C. 154(b) by 0 days.

(21) Appl. No.: 16/698,337

(22) Filed: Nov. 27, 2019

(51) Int. Cl.
| | |
|---|---|
| *H01R 13/15* | (2006.01) |
| *H05K 7/14* | (2006.01) |
| *H01R 12/72* | (2011.01) |
| *H01R 13/64* | (2006.01) |

(52) U.S. Cl.
CPC ......... *H05K 7/1455* (2013.01); *H01R 12/721* (2013.01); *H01R 13/64* (2013.01)

(58) Field of Classification Search
CPC .. H05K 7/1452; H05K 7/1455; H01R 12/721; H01R 13/64

USPC .......................................... 439/259, 260, 265
See application file for complete search history.

(56) References Cited

U.S. PATENT DOCUMENTS

| | | | |
|---|---|---|---|
| 9,118,151 B2 * | 8/2015 | Tran ..................... | H01R 12/721 |
| 10,243,304 B2 * | 3/2019 | Kirk ................... | H01R 13/6593 |
| 10,283,885 B2 * | 5/2019 | Little ..................... | H01R 24/60 |
| 10,424,856 B2 | 9/2019 | Lloyd et al. | |
| 10,424,878 B2 | 9/2019 | Lloyd et al. | |
| 10,468,798 B2 * | 11/2019 | Kolivoski .............. | H01R 12/89 |
| 10,511,127 B2 * | 12/2019 | Chang ................ | H01R 13/6584 |
| 10,559,930 B2 * | 2/2020 | Little ................. | H01R 13/6587 |

* cited by examiner

*Primary Examiner* — Khiem M Nguyen

(57) ABSTRACT

A socket connector assembly includes a socket connector and a cable assembly coupled to the socket connector. The socket connector includes a socket frame having a socket opening and a socket substrate received in the socket opening. The socket substrate includes lower socket conductors electrically connected to a host circuit board and upper socket contacts having deflectable spring beams. The cable assembly includes an outer housing and a paddle card received in a pocket having paddle card contacts at a mating end on a lower surface interfacing with the upper socket contacts. The cable assembly includes cables terminated to the paddle card communicatively coupled to corresponding paddle card contacts. The side walls of the outer housing engage an outer surface of the socket frame to locate the paddle card relative to the socket substrate.

20 Claims, 7 Drawing Sheets

SOCKET CONNECTOR AND CABLE ASSEMBLY FOR A COMMUNICATION SYSTEM

BACKGROUND OF THE INVENTION

The subject matter herein relates generally to a communication system.

The ongoing trend toward smaller, lighter, and higher performance electrical components and higher density electrical circuits has led to the development of surface mount technology in the design of printed circuit boards and electronic packages. Surface mountable packaging allows for a separable connection of an electronic package, such as an integrated circuit or a computer processor, to pads on the surface of the circuit board rather than by contacts or pins soldered in plated holes going through the circuit board. Surface mount technology may allow for an increased component density on a host circuit board, thereby saving space on the host circuit board. Conventional architecture includes electrical paths defined through the host circuit board to electrical components mounted to the host circuit board remote from the electronic package. The electrical paths are defined by circuit traces routed between the electronic package and the electrical components. The routing of the circuits between the electronic package and the electrical components occupy board space on the host circuit board. Additionally, the electrical performance of the communication system is reduced by the long lengths of the circuit traces. Conventional systems are struggling with meeting signal output while maintaining good electrical performance through the system.

A need remains for a communication system having improved electrical performance.

BRIEF DESCRIPTION OF THE INVENTION

In one embodiment, a socket connector assembly for a communication system is provided including a socket connector configured to be mounted to a host circuit board proximate to an electronic package and a cable assembly coupled to the socket connector. The socket connector includes a socket frame including an inner surface defining a socket opening and an outer surface defining a perimeter of the socket frame. A bottom of the socket frame is configured to be mounted to the host circuit board. The socket connector includes a socket substrate received in the socket opening and positioned in the socket opening by the inner surface. The socket substrate includes lower socket conductors at a lower socket substrate surface of the socket substrate for electrical connection with the host circuit board. The socket substrate includes upper socket contacts at an upper socket substrate surface of the socket substrate. Each upper socket contact includes a base configured to be terminated to the socket substrate. Each upper socket contact includes a deflectable spring beam extending from the base to a separable mating interface. The cable assembly includes an outer housing having a paddle card pocket open at a bottom of the outer housing. The outer housing has a first side wall at a first side of the paddle card pocket and a second side wall at a second side of the paddle card pocket. The cable assembly includes a paddle card received in the paddle card pocket. The paddle card extends between a mating end and a cable end. The paddle card has an upper paddle card surface and a lower paddle card surface. The paddle card includes paddle card contacts at the mating end on the lower paddle card surface interfacing with the separable mating interfaces of the upper socket contacts when the cable assembly is coupled to the socket connector. The cable assembly includes cables terminated to the paddle card at the cable end of the paddle card. The cables are communicatively coupled to corresponding paddle card contacts. The first and second side walls engage the outer surface of the socket frame to locate the paddle card relative to the socket substrate.

In an embodiment, a socket connector assembly for a communication system is provided including a socket connector configured to be mounted to a host circuit board proximate to an electronic package and a cable assembly coupled to the socket connector. The socket connector includes a socket frame including a socket opening. A bottom of the socket frame is configured to be mounted to the host circuit board. The socket connector includes a socket substrate received in the socket opening. The socket substrate includes lower socket conductors at a lower socket substrate surface of the socket substrate for electrical connection with the host circuit board and upper socket contacts at an upper socket substrate surface of the socket substrate. Each upper socket contact includes a base configured to be terminated to the socket substrate and a deflectable spring beam extending from the base to a separable mating interface. The cable assembly includes an outer housing having a paddle card pocket open at a bottom of the outer housing. The cable assembly includes a paddle card received in the paddle card pocket extending between a mating end and a cable end. The paddle card has an upper paddle card surface and a lower paddle card surface. The paddle card includes paddle card contacts at the mating end on the lower paddle card surface interfacing with the separable mating interfaces of the upper socket contacts when the cable assembly is coupled to the socket connector. The paddle card includes cable termination pads at the cable end arranged in an array such that the cable termination pads are offset in X, Y and Z directions. The cable assembly includes cables having cable ends terminated to the paddle card at the cable end of the paddle card offset in X, Y and Z directions. The cables are communicatively coupled to corresponding paddle card contacts.

In an embodiment, a communication system is provided including a host circuit board having primary contacts at a primary mounting area and secondary contacts at a secondary mounting area in close proximity to the primary mounting area. The secondary contacts being electrically connected to the primary contacts by board traces. The communication system includes an electronic package coupled to the primary mounting area of the host circuit board. The electronic package has a substrate including package contacts and an electronic component on the substrate electrically connected to the package contacts. The substrate has a lower surface facing the host circuit board. The package contacts are electrically connected to the primary contacts. The communication system includes a socket connector assembly coupled to the secondary mounting area of the host circuit board in close proximity to the electronic package. The socket connector assembly includes a socket connector configured to be mounted to a host circuit board proximate to an electronic package and a cable assembly coupled to the socket connector. The socket connector includes a socket frame including an inner surface defining a socket opening and an outer surface defining a perimeter of the socket frame. A bottom of the socket frame is configured to be mounted to the host circuit board. The socket connector includes a socket substrate received in the socket opening and positioned in the socket opening by the inner surface. The socket substrate includes lower socket conductors at a lower socket substrate surface of the socket substrate for electrical connection with the host circuit board. The socket substrate includes upper socket contacts at an upper socket substrate surface of the socket substrate. Each upper socket contact includes a base configured to be terminated to the socket substrate. Each upper socket contact includes a deflectable spring beam extending from the base to a separable mating interface. The cable assembly includes an outer housing having a paddle card pocket open at a bottom of the outer housing. The outer housing has a first side wall at a first side of the paddle card pocket and a second side wall at a second side of the paddle card pocket. The cable assembly includes a paddle card received in the paddle card pocket. The paddle card extends between a mating end and a cable end. The paddle card has an upper paddle card surface and a lower paddle card surface. The paddle card includes paddle card contacts at the mating end on the lower paddle card surface interfacing with the separable mating interfaces of the upper socket contacts when the cable assembly is coupled to the socket connector. The cable assembly includes cables terminated to the paddle card at the cable end of the paddle card. The cables are communicatively coupled to corresponding paddle card contacts. The first and second side walls engage the outer surface of the socket frame to locate the paddle card relative to the socket substrate.

DETAILED DESCRIPTION OF THE INVENTION

Figure 1:
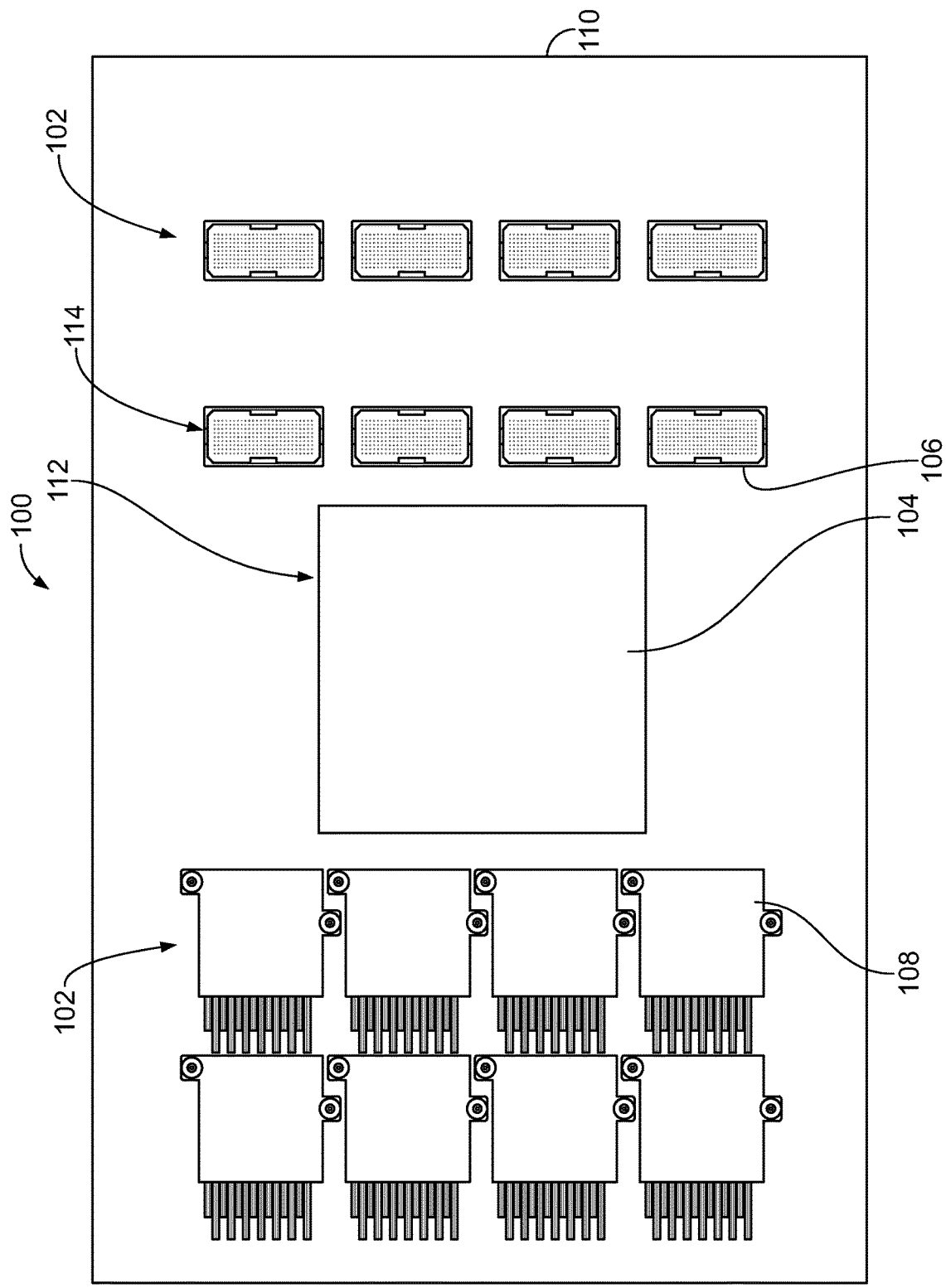
FIG. 1 illustrates a communication system formed in accordance with an exemplary embodiment.

FIG. 1 illustrates a communication system 100 formed in accordance with an exemplary embodiment. The communication system 100 includes one or more socket connector assemblies 102 electrically connected to an electronic package 104, such as an integrated circuit. Each socket connector assembly 102 includes a socket connector 106 (shown in some socket connector assemblies 102) and a cable assembly 108 (shown in other socket connector assemblies 102) coupled to the socket connector 106. The electronic package 104 and the socket connectors 106 are coupled to a host circuit board 110, such as a motherboard. The socket connector 106 is electrically connected to the electronic package 104 through the host circuit board 110. The socket connector 106 electrically connects the electronic package 104 with the cable assembly 108. In various embodiments, the electronic package 104 may be directly coupled to the host circuit board 110, such as soldering the electronic package 104 using a ball grid array of solder balls. In other various embodiments, the electronic package 104 may be coupled to the host circuit board 110 using a socket connector.

In the illustrated embodiment, the electronic package 104 is coupled to the top of the host circuit board 110 at a primary mating area 112 and the socket connector assemblies 102 are coupled to the top of the host circuit board 110 at secondary mating areas 114. The electronic package 104 may transmit high speed data, low speed data and/or power through the interface between the electronic package 104 and the host circuit board 110. The socket connectors 106 may transmit high speed data, low speed data and/or power through the interface between the socket connectors 106 and the host circuit board 110. In an exemplary embodiment, high speed data signals may be transmitted between the socket connector assemblies 102 and the electronic package 104. The secondary mating areas 114 are in close proximity to the primary mating area 112, such as immediately adjacent the primary mating area 112. As such, the socket connector assemblies 102 are located in close proximity to the electronic package 104, such as immediately adjacent to the electronic package 104. As such, the circuit traces of the host circuit board 110 connecting the socket connector assemblies 102 and the electronic package 104 are relatively short. The circuit traces have little signal degradation along the short circuit traces between the electronic package 104 and the socket connector assemblies 102. The socket connector assemblies 102 may be arranged in multiple rows. In the illustrated embodiment, the socket connector assemblies 102 are arranged at two opposite sides of the electronic package 104 (for example, in an East/West orientation), leaving the other two sides (for example, North/South) open for airflow through the communication system 100. Other arrangements are possible in alternative embodiments. Other components may be coupled to the host circuit board 110 at tertiary mating areas.

The electronic package 104 may be any type of component, such as a data communication device. For example, the electronic package 104 may be an integrated circuit, such as an application-specific integrated circuit (ASIC), a chip, a microprocessor, and the like. In other various embodiments, the electronic package 104 may be an electrical connector, such as a high speed differential pair receptacle connector, a header connector, a card edge connector, and the like. The electrical connector may define an interface for interfacing with another mating connector, such as a cable connector, a paddle card connector, or another type of mating connector.

Figure 2:
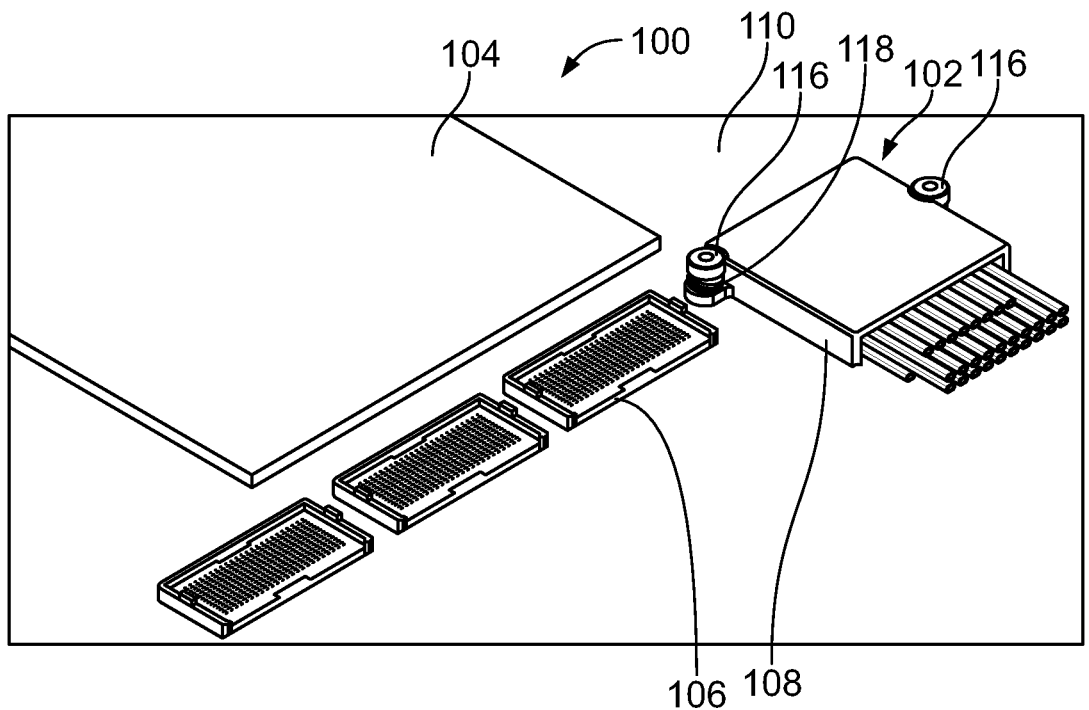
FIG. 2 is a perspective view of a portion of the communication system showing socket connector assemblies in accordance with an exemplary embodiment.
Figure 3:
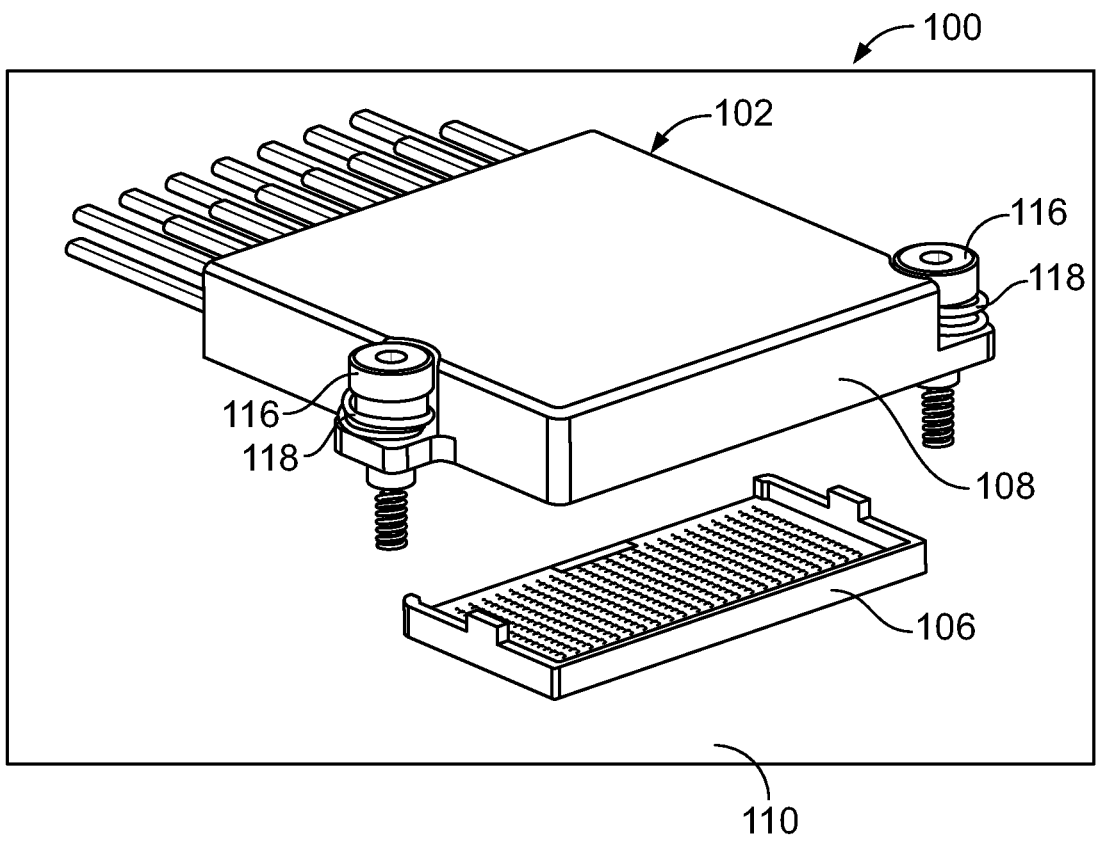
FIG. 3 is a perspective view of the socket connector assembly in accordance with an exemplary embodiment.

FIG. 2 is a perspective view of a portion of the communication system 100 showing the electronic package 104 coupled to the host circuit board 110 and a set of socket connector assemblies 102 coupled to the host circuit board 110. FIG. 3 is a perspective view of the socket connector assembly 102 in accordance with an exemplary embodiment showing one of the socket connectors 106 mounted to the host circuit board 110 and the cable assembly 108 poised for coupling to the socket connector 106 and the host circuit board 110. FIG. 2 illustrates three of the socket connectors 106 coupled to the host circuit board 110, with the cable assemblies 108 removed to illustrate the socket connectors 106. FIG. 2 illustrates one of the socket connector assemblies 102 with the cable assembly 108 coupled to the corresponding socket connector 106 and the host circuit board 110.

In an exemplary embodiment, the cable assemblies 108 are coupled to the socket connectors 106 at separable interfaces. For example, each socket connector 106 includes an array of socket contacts having separable mating interfaces. The socket contacts may define a compressible interface, such as including deflectable spring beams that are compressed when the cable assembly 108 is coupled to the socket connector 106. In an exemplary embodiment, the cable assembly 108 is mounted to the host circuit board 110 using mounting hardware 116. The mounting hardware 116 may be threaded fasteners. The mounting hardware 116 may be used to compress the mating interface with the socket connector 106. In various embodiments, the mounting hardware 116 includes springs 118 used to spring bias the cable assembly 108 downward against the socket connector 106.

In an exemplary embodiment, the socket connector assembly 102 has a low profile or height above the host circuit board 110. For example, the height may be similar to the height of the electronic package 104. The low profile allows connection of a heat sink or other component to the top of the electronic package, such as to dissipate heat from the chip of the electronic package 104. The cables of the cable assemblies 108 extend outward from the sides within the low profile of the socket connector assemblies 102.

Figure 4:
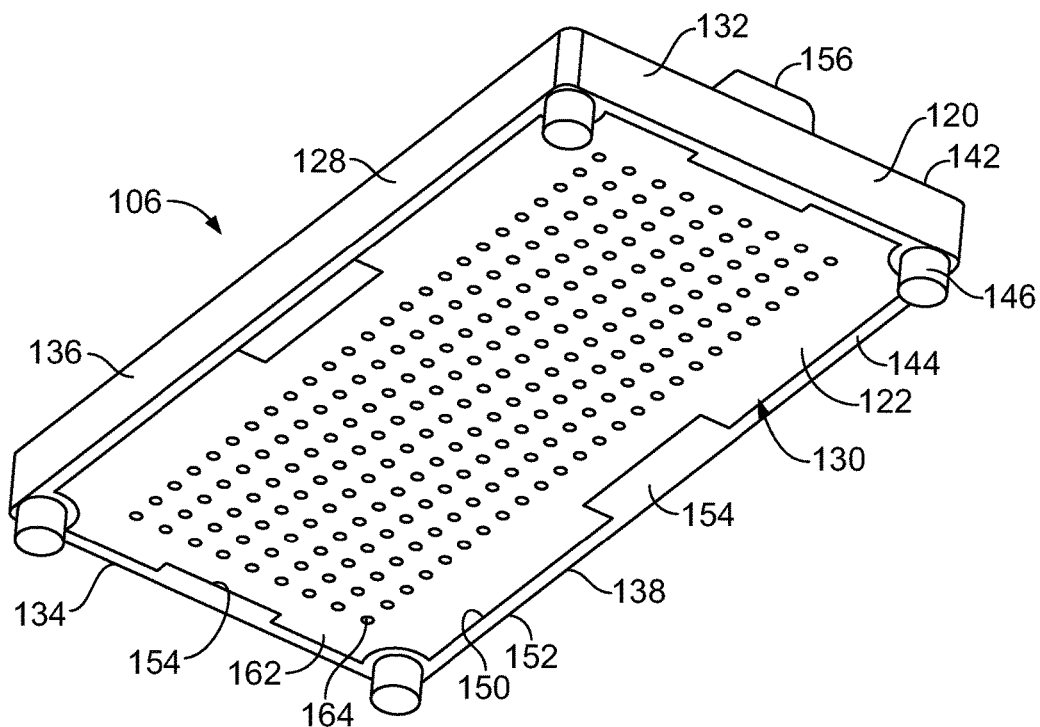
FIG. 4 is a bottom perspective view of a socket connector of the socket connector assembly in accordance with an exemplary embodiment.
Figure 5:
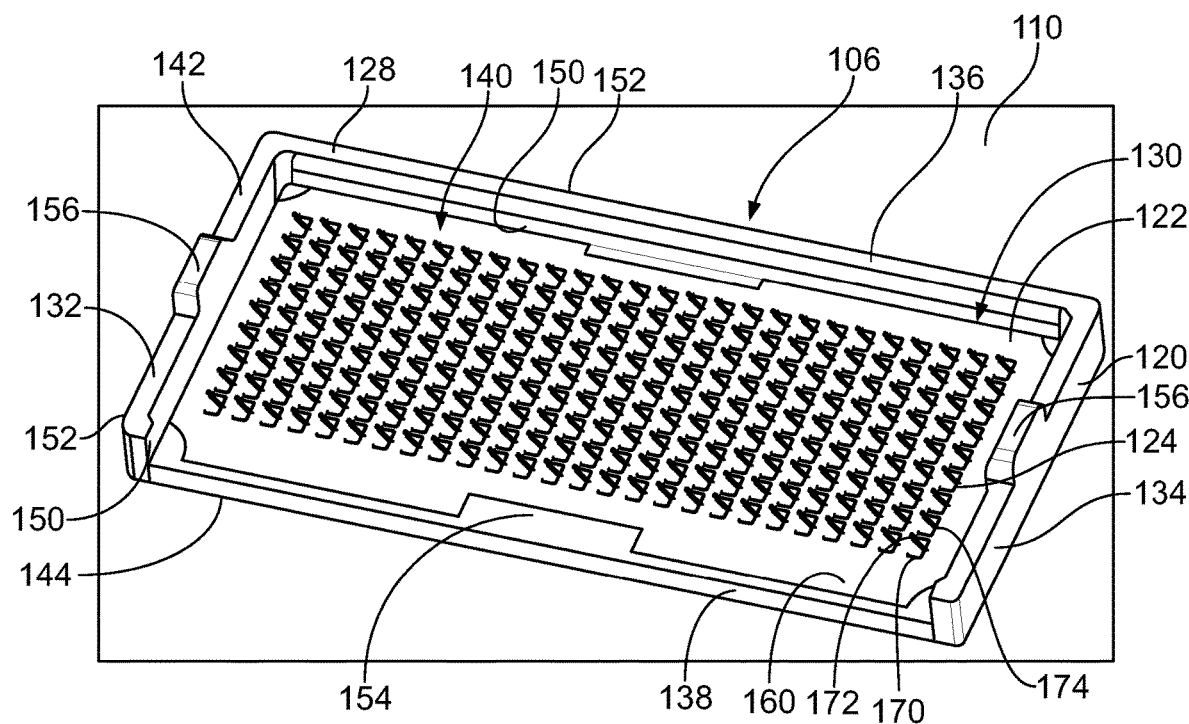
FIG. 5 is a top perspective view of the socket connector in accordance with an exemplary embodiment.
Figure 6:
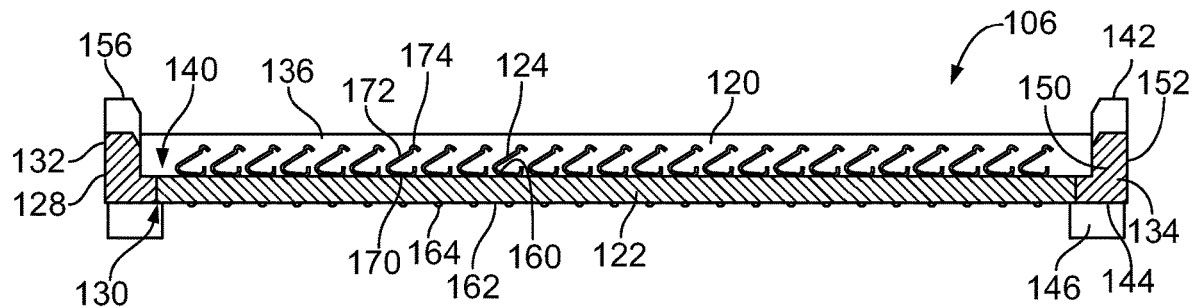
FIG. 6 is a cross sectional view of the socket connector in accordance with an exemplary embodiment.

FIG. 4 is a bottom perspective view of the socket connector 106 in accordance with an exemplary embodiment. FIG. 5 is a top perspective view of the socket connector 106 in accordance with an exemplary embodiment. FIG. 6 is a cross sectional view of the socket connector 106 in accordance with an exemplary embodiment.

In an exemplary embodiment, the socket connector 106 includes a socket frame 120 and a socket substrate 122 held in the socket frame 120. The socket substrate 122 may be a printed circuit board. The socket substrate 122 includes conductors, such as traces, vias, pads, and the like. The conductors may have solder balls, solder pads, or deflectable spring beams at the bottom of the socket substrate 122 for electrically connecting to the host circuit board 110. The socket substrate 122 includes socket contacts 124 coupled to corresponding conductors of the socket substrate 122. The socket contacts 124 are configured to be electrically connected to the cable assembly 108 (shown in FIG. 3). The socket contacts 124 may be arranged in an array defining a land grid array (LGA) interface.

The socket frame 120 holds and supports the socket substrate 122. The socket frame 120 may have locating features for locating the socket substrate 122 relative to the socket frame 120. The socket frame 120 includes frame walls 128 that surround a socket opening 130 that receives the socket substrate 122. The frame walls 128 may orient and align the socket substrate 122 in one or more directions. In an exemplary embodiment, the socket frame 120 may limit or stop compression of the compressible interface to prevent damage to various components.

The socket frame 120 includes a first side wall 132, a second side wall 134 opposite the first side wall 132, a first end wall 136 and a second end wall 138 opposite the first end wall 136. In the illustrated embodiment, the second end wall 138 has a reduced height compared to the side walls 132, 134 and the first end wall 136, such as to allow the cable assembly 108 to mate with and/or extend from the socket substrate 122. The side walls 132, 134 and the first end wall 136 form a pocket 140 configured to receive a portion of the cable assembly 108. The open second end wall 138 allows access to the pocket 140 from the second end of the socket frame 120. In an exemplary embodiment, the pocket 140 is open at a top 142 of the socket frame 120, such as to receive a portion of the cable assembly 108. A bottom 144 of the socket frame 120, opposite the top 142, is configured to be mounted to the host circuit board 110. In an exemplary embodiment, the socket frame 120 includes mounting posts 146 extending from the bottom 144 used to locate the socket frame 120, and thus the socket substrate 122, relative to the host circuit board 110.

In an exemplary embodiment, the socket frame 120 includes an inner surface 150 defining the socket opening 130 and an outer surface 152 opposite the inner surface 150. The outer surface defines a perimeter of the socket frame 120. Each of the side walls 132, 134 and each of the end walls 136, 138 includes corresponding inner surfaces 150 and corresponding outer surfaces 152. The socket frame 120 may include locating features 154 (FIG. 4) extending from the inner surface 150 into the socket opening 130 for locating the socket substrate 122 in the socket opening 130. In an exemplary embodiment, the socket frame 120 includes alignment tabs 156 (FIG. 5) extending from the socket frame 120 at the top 142, such as from the first and second side walls 132, 134. The alignment tabs 156 are used to align the cable assembly 108 with the socket connector 106. In the illustrated embodiment, the alignment tabs are elongated tabs generally aligned with the side walls 132, 134. The tops of the alignment tabs 156 may be angled or chamfered to guide mating. Other types of alignment tabs 156 may be provided in alternative embodiments.

The socket substrate 122 extends between an upper socket substrate surface 160 and a lower socket substrate surface 162. The socket contacts 124 are coupled to the socket substrate 122 at the upper socket substrate surface 160. The socket contacts 124 provide a separable, compressible mating interface at the top of the socket substrate 122. In an exemplary embodiment, the socket substrate 122 includes lower socket conductors 164 at the lower socket substrate surface 162. In the illustrated embodiment, the lower socket conductors 164 include solder balls soldered to pads at the lower socket substrate surface 162. Other types of conductors may be provided at the bottom in alternative embodiments. For example, in various embodiments, the socket contacts 124 may be provided at the lower socket substrate surface 162 to provide a separable, compressible mating interface at the bottom of the socket substrate 122.

The socket contacts 124 are arranged in rows and columns as an array. The socket contacts 124 are arranged in the pocket 140 for mating with the cable assembly 108. Each socket contact 124 includes a base 170 and a deflectable spring beam 172 extending from the base 170. The spring beam 172 extends to a separable mating interface 174 opposite the base 170. The spring beam 172 may be curved at the mating interface 174. The base 170 is mounted to the socket substrate 122. The base 170 may be soldered to the socket substrate 122, such as to a pad at the upper socket substrate surface 162. In various embodiments, the socket contact 124 may include a tail, such as a solder tail or a press-fit tail received in a plated via of the socket substrate 122.

Figure 7:
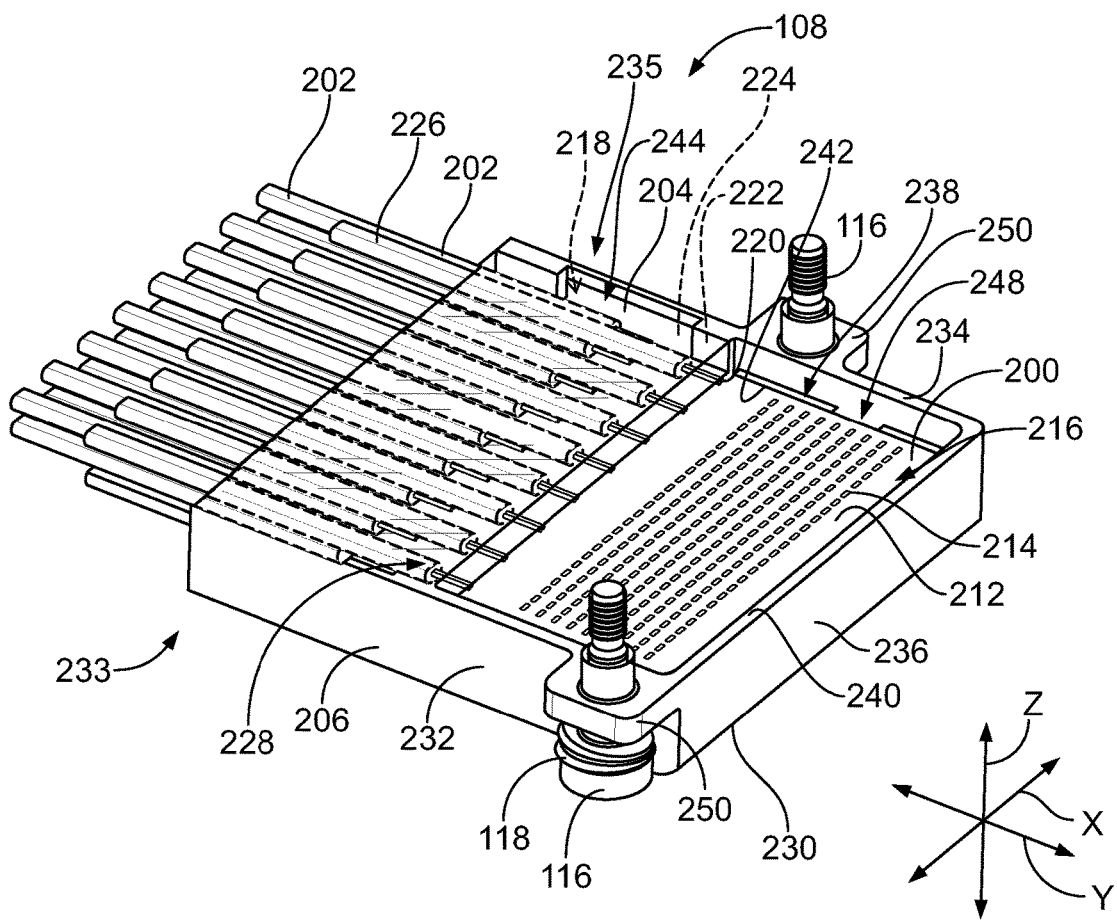
FIG. 7 is a bottom perspective view of a cable assembly of the socket connector assembly in accordance with an exemplary embodiment.
Figure 8:
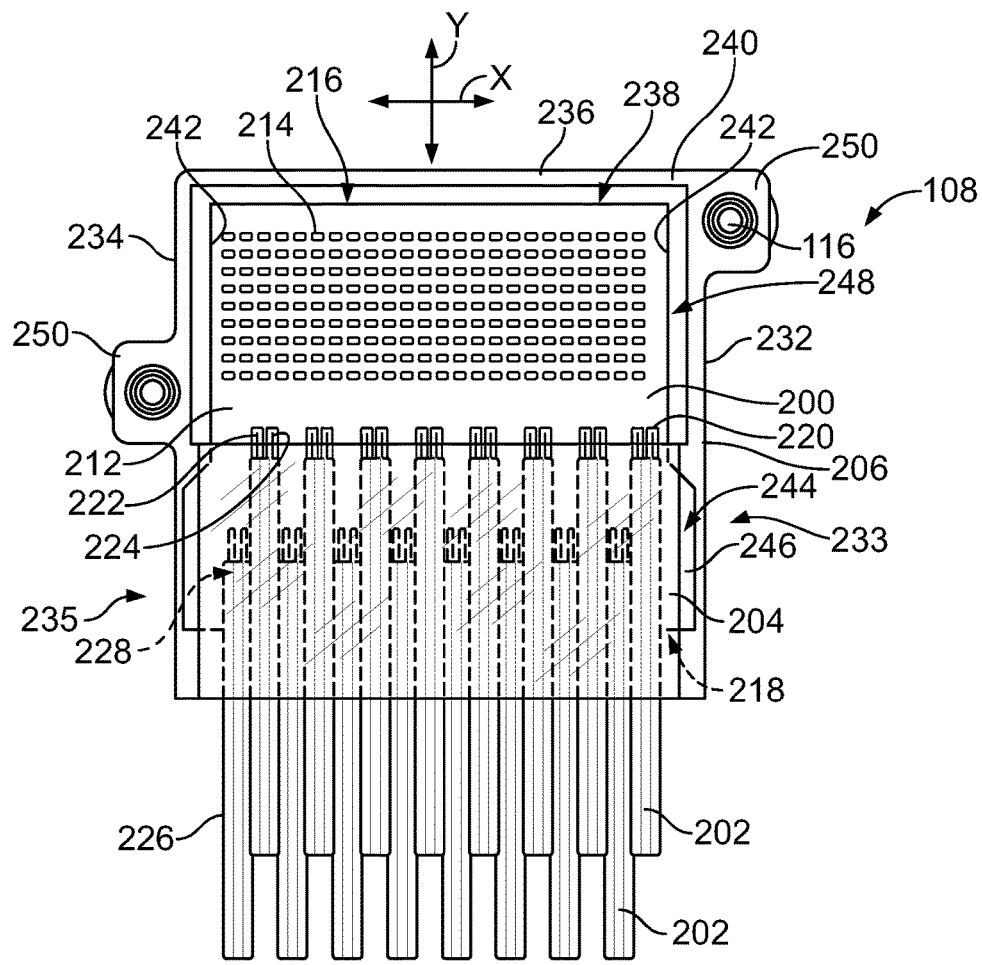
FIG. 8 is a bottom view of the cable assembly in accordance with an exemplary embodiment.
Figure 9:
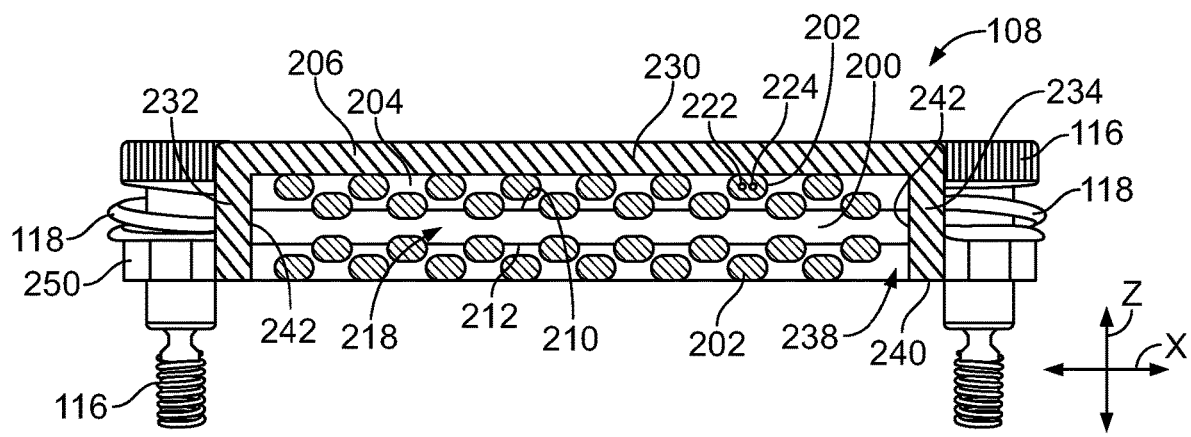
FIG. 9 is a rear view of the cable assembly in accordance with an exemplary embodiment.

FIG. 7 is a bottom perspective view of the cable assembly 108 in accordance with an exemplary embodiment. FIG. 8 is a bottom view of the cable assembly 108 in accordance with an exemplary embodiment. FIG. 9 is a rear view of the cable assembly 108 in accordance with an exemplary embodiment.

The cable assembly 108 includes a paddle card 200, cables 202 extending from the paddle card 200, an inner housing 204, and an outer housing 206. The paddle card 200 extends between an upper paddle card surface 210 and a lower paddle card surface 212. The paddle card 200 includes paddle card contacts 214 at the lower paddle card surface 212. The paddle card 200 extends between a mating end 216 and a cable end 218. The paddle card contacts 214 are provided at the mating end 216 for mating with the socket connector 106 (shown in FIG. 4). In an exemplary embodiment, the paddle card contacts 214 are arranged in rows and columns as an array. The array of paddle card contacts 214 corresponds with the array of socket contacts 124 (shown in FIG. 5) for interfacing with the socket contacts 124.

The cables 202 are coupled to the paddle card 200 proximate to the cable end 218. For example, cable termination pads 220 may be provided at the upper paddle card surface 210 and/or the lower paddle card surface 212 at the cable end 218. In an exemplary embodiment, the cable termination pads 220 are circuit traces. Other types of contacts may be provided in alternative embodiments to electrically connect the cables 202 to the paddle card 200. In other various embodiments, the cables 202 may be fiber optic cables connected to the paddle card 200 at an optical connector. In an exemplary embodiment, the cable termination pads 220 are arranged in an array such that the cable termination pads 220 are offset in X, Y and Z directions (X and Y axes are shown in FIG. 8 and X and Z directions are shown in FIG. 9). Staggering of the cable termination pads 220 allows a denser array of cable termination pads 220. A greater number of cable termination pads 220 may be provided within a given footprint (for example, within one or more dimensions). For example, staggering the cable termination pads 220 in the Y direction allows greater spacing of the contact pads 220 in the X direction and/or to allow positioning of ground contacts or shielding between signal contacts. Staggering of the cable termination pads 220 in the Z direction (for example, providing the cable termination pads 220 on the upper paddle card surface 210 and on the lower paddle card surface 212) allows greater spacing of the contact pads 220.

In an exemplary embodiment, the cables 202 may be twin-axial cables having first and second conductors 222, 224 arranged as pairs and may include a cable shield (not shown) providing electrical shielding for the pairs of conductors 222, 224. The cable shield may be electrically connected to the paddle card 200, for example, via ground termination pads on the paddle card 200. The cable 202 includes a cable jacket 226 surrounding the cable shield and the conductors 222, 224. Other types of cables may be provided in alternative embodiments. Ends 228 of the cables 202 are terminated to the paddle card 200. The ends 228 of the cables 202 may be arranged in two rows for connecting to two staggered rows of the cable termination pads 220. The cables 202 are nested in the spaces between other cables for tighter packaging of the cables 202.

The inner housing 204 is coupled to the paddle card 200, such as to the upper paddle card surface 210 and the lower paddle card surface 212. The inner housing 204 may be coupled to the cables 202, such as to provide strain relief. In various embodiments, the inner housing 204 may be molded in place on the paddle card 200 and the cables 202. For example, the inner housing 204 may be an overmolded body. The inner housing 204 may be manufactured from a dielectric material, such as a plastic material.

The outer housing 206 receives the inner housing 204, the paddle card 200 and portions of the cables 202. The cables 202 extend rearward from the outer housing 206. In an exemplary embodiment, the outer housing 206 includes an upper wall 230, a first side wall 232 at a first side 233, a second side wall 234 at a second side 235, and an end wall 236 between the side walls 232, 234 forming a paddle card pocket 238. The paddle card pocket 238 is open at a bottom 240 of the outer housing 206. The paddle card pocket 238 receives the paddle card 200.

In an exemplary embodiment, the outer housing 206 includes locating walls 242 that engage the paddle card 200 and locate the paddle card 200 within the paddle card pocket 238. The locating walls 242 may engage edges of the paddle card 200 to locate the paddle card 200 within the paddle card pocket 238. The paddle card 200 may be held in the paddle card pocket 238 by an interference fit. In an exemplary embodiment, the outer housing 206 includes locating pockets 244, such as in the side walls 232, 234 that receive locating tabs 246 of the paddle card 200 to locate the paddle card 200 in the outer housing 206. Other types of locating features may be used in alternative embodiments to position the paddle card 200 in the outer housing 206. In an exemplary embodiment, the outer housing 206 includes alignment channels 248, such as in the side walls 232, 234, to align the paddle card 200 relative to the socket connector 106. For example, the alignment channels 248 may receive the alignment tabs 156 (shown in FIG. 5).

In an exemplary embodiment, the outer housing 206 includes mounting tabs 250 extending therefrom, such as from the side walls 232, 234. The mounting tabs 250 hold the mounting hardware 116. For example, the mounting hardware 116 may be shoulder screws received in openings in the mounting tabs 250. The springs 118 are captured between the mounting hardware 116 and the mounting tabs 250.

Figure 10:
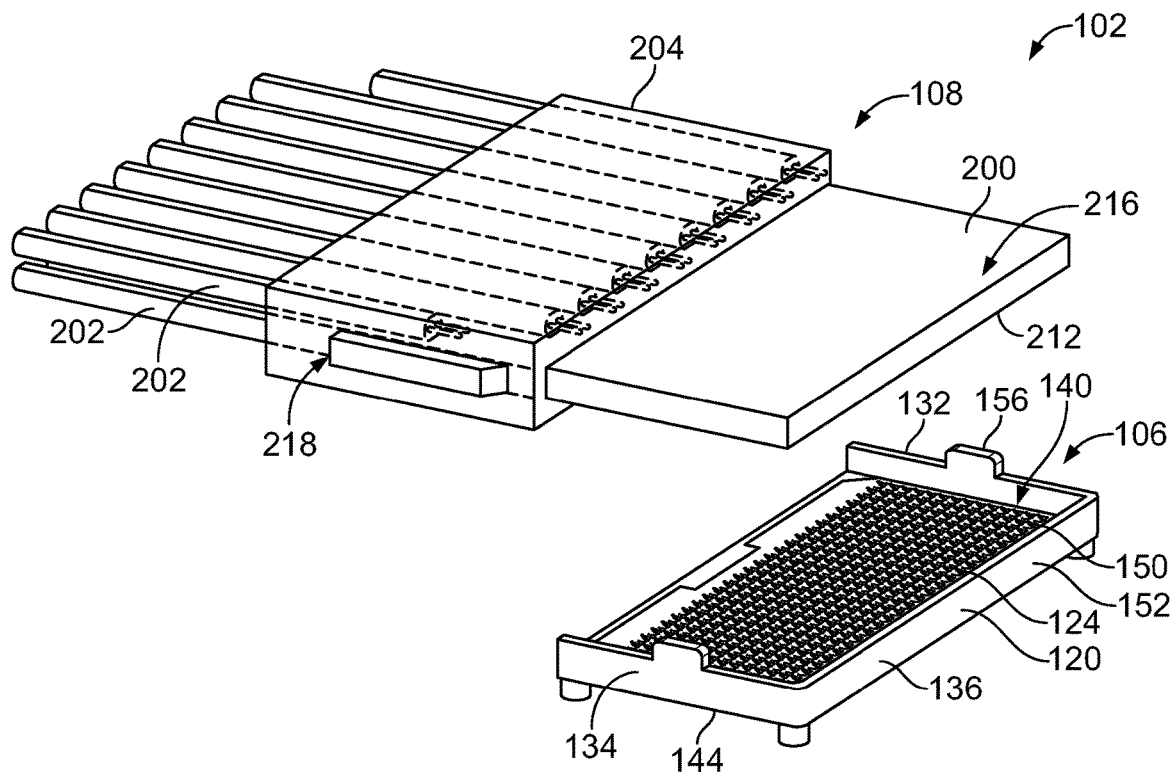
FIG. 10 is a top perspective view of a portion of the socket connector assembly in accordance with an exemplary embodiment showing the cable assembly poised for coupling to the socket connector.
Figure 11:
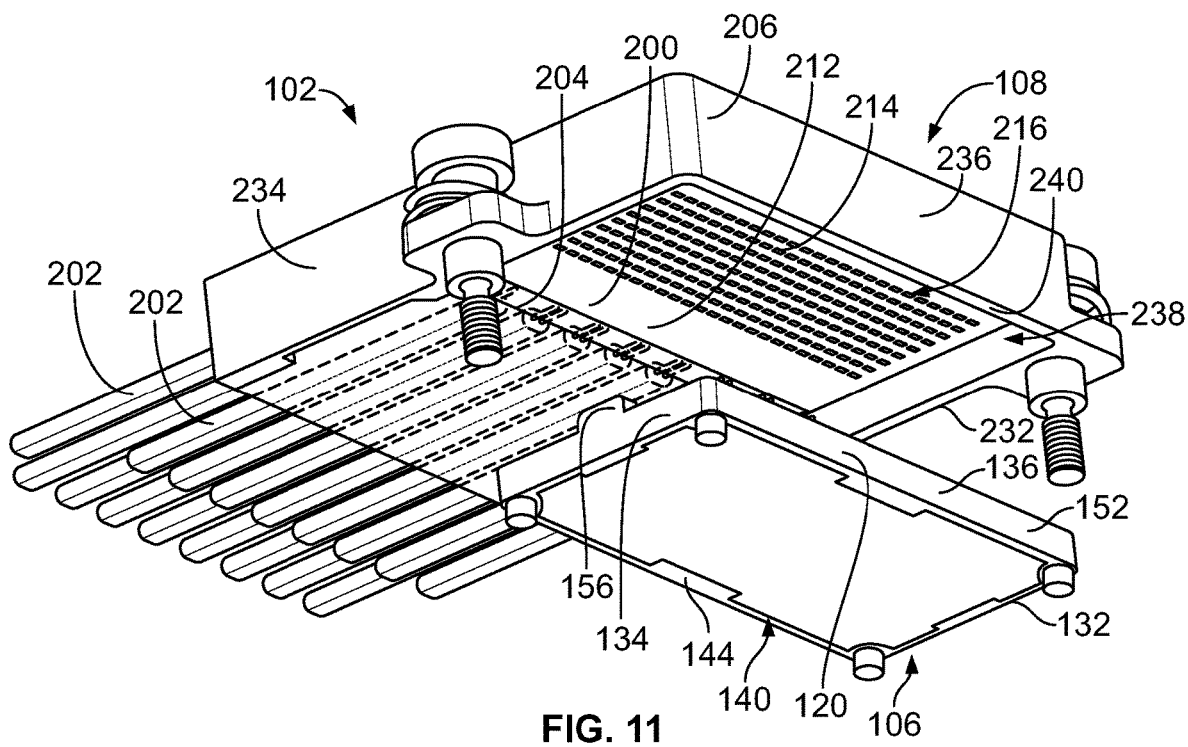
FIG. 11 is a bottom perspective view of the socket connector assembly in accordance with an exemplary embodiment showing the cable assembly poised for coupling to the socket connector.

FIG. 10 is a top perspective view of a portion of the socket connector assembly 102 in accordance with an exemplary embodiment showing the cable assembly 108 poised for coupling to the socket connector 106. FIG. 11 is a bottom perspective view of the socket connector assembly 102 in accordance with an exemplary embodiment showing the cable assembly 108 poised for coupling to the socket connector 106. FIG. 10 illustrates the socket connector assembly 102 without the outer housing 206 to illustrate the inner housing 204, the cables 202 and the paddle card 200. FIG. 11 illustrates the socket connector assembly 102 with the inner housing 204, the cables 202 and the paddle card 200 received in the paddle card pocket 238 of the outer housing 206.

The cables 202 extend from the cable end 218 of the paddle card 200. The inner housing 204 is coupled to the paddle card 200 and the cables 202 at the cable end 218. The inner housing 204 provides strain relief for the cables 202. The mating end 216 of the paddle card 200 is configured to be coupled to the socket connector 106. The paddle card contacts 214 are provided at the lower paddle card surface 212 at the mating end 216 for mating with the socket contacts 124.

In an exemplary embodiment, the pocket 140 of the socket frame 120 is configured to receive the mating end 216 of the paddle card 200. For example, the paddle card 200 is received between the side walls 132, 134. The inner surfaces 150 of the side walls 132, 134 may engage the paddle card 200 to hold the paddle card 200 in the socket frame 120. The first end wall 136 may engage the paddle card 200 to position the paddle card 200 in the socket frame 120. The alignment tabs 156 may be used to guide the paddle card 200 into the pocket 140. The paddle card 200 is loaded into the pocket 140 from above in a downward mating direction. In an exemplary embodiment, the alignment tabs 156 are configured to engage the outer housing 206 to position the cable assembly 108 relative to the socket connector 106. The alignment tabs 156 may be received in the alignment channels 248 to engage the side edges of the paddle card 200.

In an exemplary embodiment, the outer housing 206 is configured to surround the socket connector 106. For example, the socket connector 106 is configured to be received in the paddle card pocket 238. The outer housing 206 may provide electrical shielding for the socket connector 106 and the paddle card 200. When mated, the first side wall 232 extends along the outer surface 152 of the first side wall 132 of the socket frame 120 and the second side wall 234 extends along the outer surface 152 of the second side wall 134. The end wall 236 extends along the outer surface 152 of the first end wall 236. In an exemplary embodiment, the socket connector 106 is completely enclosed in the outer housing 206 of the cable connector 108. For example, the bottom 240 of the outer housing 206 is configured to be aligned with the bottom 144 of the socket frame 120.

Figure 12:
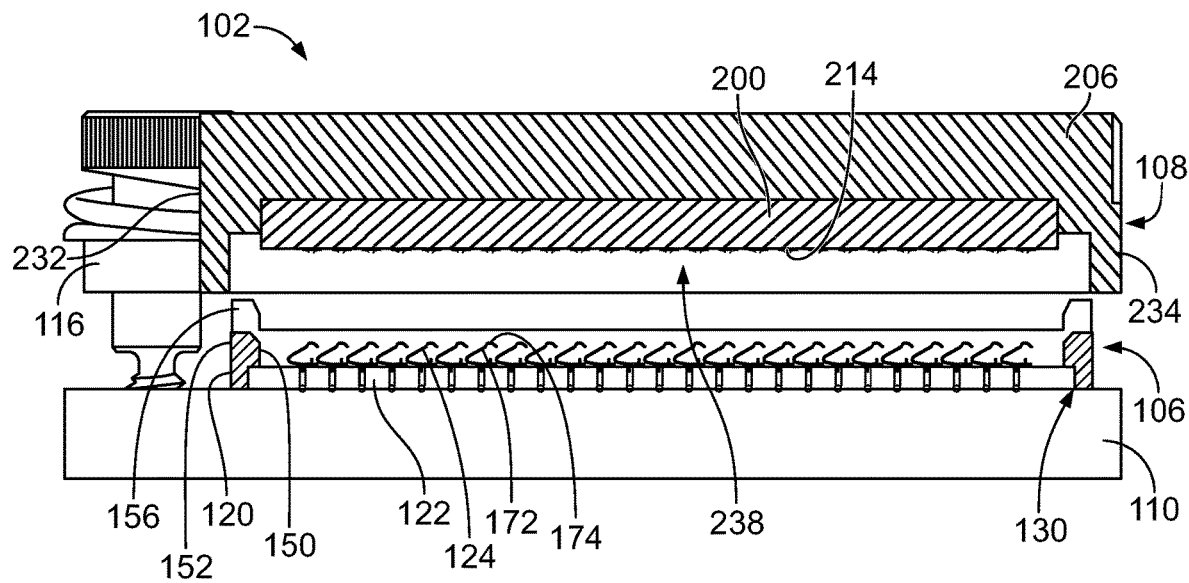
FIG. 12 is a cross sectional view of the socket connector assembly mounted to the host circuit board.
Figure 13:
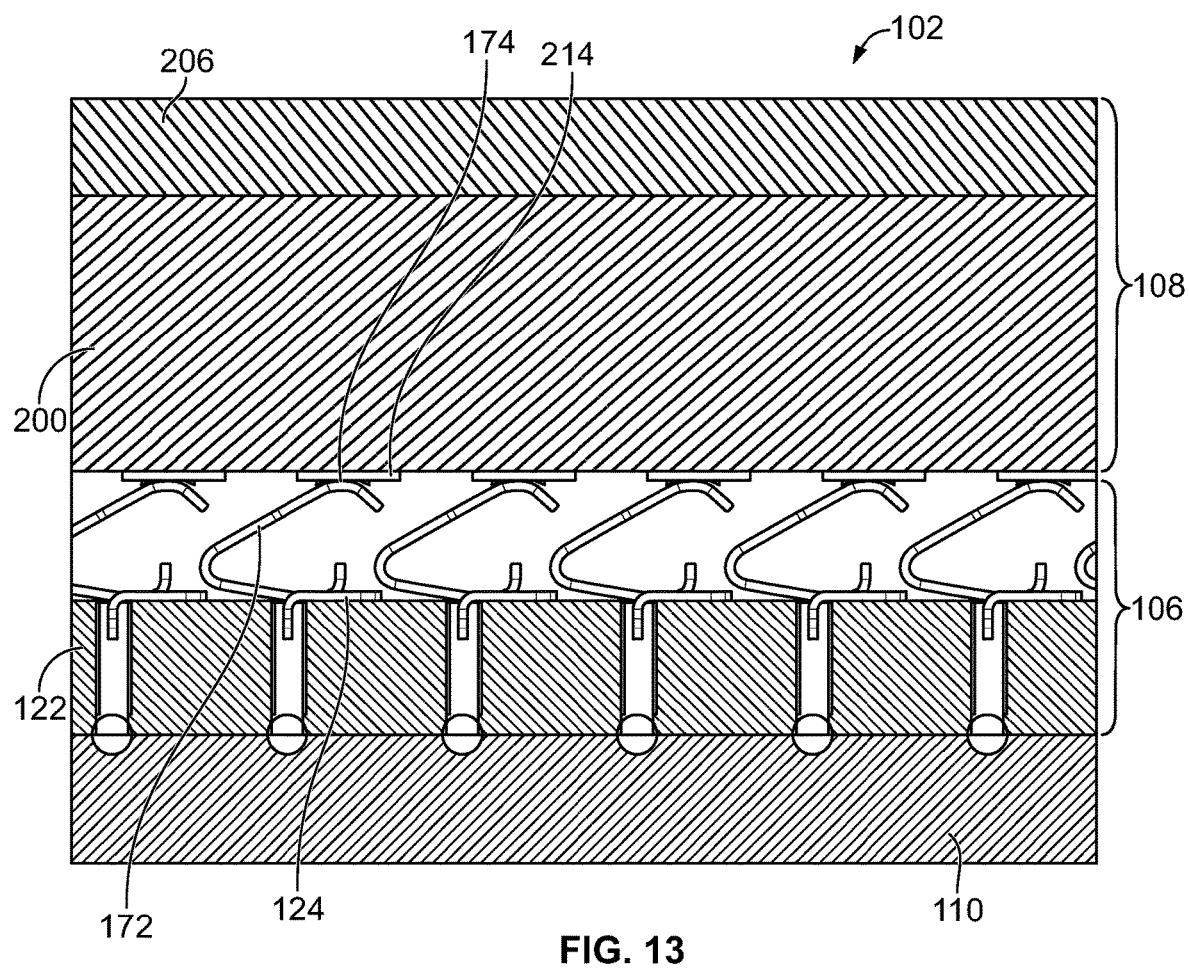
FIG. 13 is a cross sectional view of a portion of the socket connector assembly mounted to the host circuit board.

FIG. 12 is a cross sectional view of the socket connector assembly 102 mounted to the host circuit board 110. FIG. 13 is a cross sectional view of a portion of the socket connector assembly 102 mounted to the host circuit board 110. FIG. 12 shows the cable assembly 108 poised for mating with the socket connector 106. FIG. 13 shows the cable assembly 108 coupled to the socket connector 106.

During mating, the cable assembly 108 is mounted to the socket connector 106 from above. The cable assembly 108 is aligned with the socket connector 106, such as using the mounting hardware 116. The socket frame 120 is aligned with the paddle card pocket 238. The alignment tabs 156 are configured to engage the first and second side walls 232, 234 to align the outer housing 206 with the socket frame 120. The mounting hardware 116 may provide course alignment and the alignment tabs 156 may provide fine alignment of the outer housing 206 with the socket frame 120. The side walls 232, 234 are configured to engage the outer surface 152 of the socket frame 120 to surround the socket connector 106. As the cable assembly 108 is mated to the socket connector 106 (for example, as the threaded ends of the mounting hardware are rotated to pull the cable assembly 108 downward), the socket connector 106 is received in the paddle card pocket 238. The paddle card 200 is moved downward toward the socket connector 106, such as toward the socket contacts 124.

The paddle card 200 is held within the outer housing 206 and positioned in the paddle card pocket 238 by the walls of the outer housing 206 and/or the locating features of the outer housing 206. The outer housing 206 controls the position of the paddle card 200 such that the array of paddle card contacts 214 is aligned with the array of socket contacts 124. As the cable assembly 108 is lowered in the mating direction, the paddle card 200 is received in the socket opening 130. In various embodiments, the edges of the paddle card 200 may engage the inner surfaces 150 of the walls of the socket frame 120 to position the paddle card 200 relative to the socket frame 120, and thus the array of socket contacts 124. The paddle card contacts 214 are pressed downward into the socket contacts 124. The spring beams 172 are compressed downward such that the mating interfaces 174 are forced outward against the paddle card contacts 214. In an alternative embodiment, the paddle card 200 may include the socket contacts with deflectable spring beams and the socket substrate 122 may include contact pads.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A socket connector assembly for a communication system comprising:

a socket connector configured to be mounted to a host circuit board proximate to an electronic package, the socket connector including a socket frame including an inner surface defining a socket opening and an outer surface defining a perimeter of the socket frame, a bottom of the socket frame configured to be mounted to the host circuit board, the socket connector including a socket substrate received in the socket opening and positioned in the socket opening by the inner surface, the socket substrate including lower socket conductors at a lower socket substrate surface of the socket substrate for electrical connection with the host circuit board, the socket substrate including upper socket contacts at an upper socket substrate surface of the socket substrate, each upper socket contact including a base configured to be terminated to the socket substrate, each upper socket contact including a deflectable spring beam extending from the base to a separable mating interface; and a cable assembly coupled to the socket connector, the cable assembly including an outer housing having a paddle card pocket open at a bottom of the outer housing, the outer housing having a first side wall at a first side of the paddle card pocket and a second side wall at a second side of the paddle card pocket, the cable assembly including a paddle card received in the paddle card pocket, the paddle card extending between a mating end and a cable end, the paddle card having an upper paddle card surface and a lower paddle card surface, the paddle card including paddle card contacts at the mating end on the lower paddle card surface interfacing with the separable mating interfaces of the upper socket contacts when the cable assembly is coupled to the socket connector, the cable assembly including cables terminated to the paddle card at the cable end of the paddle card, the cables being communicatively coupled to corresponding paddle card contacts, wherein the first and second side walls engage the outer surface of the socket frame to locate the paddle card relative to the socket substrate.

2. The socket connector assembly of claim 1, wherein the socket frame includes an alignment tab extending from a top of the socket frame.

3. The socket connector assembly of claim 2, wherein the alignment tab engages the outer housing to align the paddle card with the socket substrate.

4. The socket connector assembly of claim 2, wherein the paddle card includes an alignment channel at an edge of the paddle card, the alignment tab being received in the alignment channel between the paddle card and the outer housing to align the paddle card with the socket substrate.

5. The socket connector assembly of claim 1, wherein the spring beams are deflected by the paddle card when the cable assembly is coupled to the socket contacts.

6. The socket connector assembly of claim 1, wherein the outer housing includes mounting hardware coupled to the host circuit board to secure the cable assembly to the host circuit board independent from the socket connector.

7. The socket connector assembly of claim 6, wherein the mounting hardware is spring loaded to compress the spring beams.

8. The socket connector assembly of claim 1, wherein the cables are terminated to the upper paddle card surface and to the lower paddle card surface.

9. The socket connector assembly of claim 1, wherein the paddle card includes cable termination pads, the cable termination pads being staggered at different distances from the cable end of the paddle card.

10. The socket connector assembly of claim 1, wherein the paddle card includes cable termination pads at the cable end, the cable termination pads being arranged in an array such that the cable termination pads are offset in X, Y and Z directions, the cables having cable ends terminated to the cable termination pads at the cable end of the paddle card, the cable ends being offset in the X, Y and Z directions.

11. The socket connector assembly of claim 1, wherein the outer housing includes an end wall between the first side wall and the second side wall, the end wall defining the paddle card pocket, the end wall, the first side wall, and the second side wall surrounding the socket frame.

12. The socket connector assembly of claim 11, wherein the end wall faces the electronic package, the end wall being positioned between the socket frame and the electronic package.

13. The socket connector assembly of claim 1, wherein the cable assembly includes an inner housing coupled to the paddle card, the inner housing surrounding the cables to provide strain relief for the cables, the outer housing being conductive to provide electrical shielding for the paddle card, the cables, and the socket connector.

14. A socket connector assembly for a communication system comprising:

a socket connector configured to be mounted to a host circuit board proximate to an electronic package, the socket connector including a socket frame forming a socket opening, a bottom of the socket frame configured to be mounted to the host circuit board, the socket connector including a socket substrate received in the socket opening, the socket substrate including lower socket conductors at a lower socket substrate surface of the socket substrate for electrical connection with the host circuit board, the socket substrate including upper socket contacts at an upper socket substrate surface of the socket substrate, each upper socket contact including a base configured to be terminated to the socket substrate, each upper socket contact including a deflectable spring beam extending from the base to a separable mating interface; and a cable assembly coupled to the socket connector, the cable assembly including an outer housing having a paddle card pocket open at a bottom of the outer housing, the cable assembly including a paddle card received in the paddle card pocket, the paddle card extending between a mating end and a cable end, the paddle card having an upper paddle card surface and a lower paddle card surface, the paddle card including paddle card contacts at the mating end on the lower paddle card surface interfacing with the separable mating interfaces of the upper socket contacts when the cable assembly is coupled to the socket connector, the paddle card including cable termination pads at the cable end, the cable termination pads being arranged in an array such that the cable termination pads are offset in X, Y and Z directions, the cable assembly including cables having cable ends terminated to the paddle card at the cable end of the paddle card, the cable ends being offset in the X, Y and Z directions, the cables being communicatively coupled to corresponding paddle card contacts.

15. The socket connector assembly of claim 14, wherein the cable termination pads include a first upper row of cable termination pads on the upper paddle card surface at a first distance from the cable end and a second upper row of cable termination pads on the upper paddle card surface at a second distance from the cable end different than the first distance, and wherein the cable termination pads include a first lower row of cable termination pads on the lower paddle card surface at a third distance from the cable end and a second lower row of cable termination pads on the lower paddle card surface at a fourth distance from the cable end different than the third distance.

16. The socket connector assembly of claim 14, wherein the socket frame includes an inner surface defining the socket opening and an outer surface defining a perimeter of the socket frame, the socket substrate being positioned in the socket opening by the inner surface, the outer housing of the cable assembly having a first side wall at a first side of the paddle card pocket, a second side wall at a second side of the paddle card pocket, and an end wall extending between the first and second side walls, wherein the first and second side walls engage the outer surface of the socket frame to locate the paddle card side-to-side relative to the socket substrate and wherein the end wall engages the outer surface of the socket frame to locate the paddle card front-to-rear relative to the socket substrate.

17. The socket connector assembly of claim 14, wherein the socket frame includes an alignment tab extending from a top of the socket frame, the alignment tab engaging the outer housing to align the paddle card with the socket substrate, wherein the paddle card includes an alignment channel at an edge of the paddle card, the alignment tab being received in the alignment channel between the paddle card and the outer housing to align the paddle card with the socket substrate.

18. The socket connector assembly of claim 14, wherein the outer housing includes fasteners coupled to the host circuit board to secure the cable assembly to the host circuit board independent from the socket connector, the fasteners being spring loaded to compress the spring beams.

19. The socket connector assembly of claim 14, wherein the end wall, the first side wall, and the second side wall are coupled to the host circuit board such that the outer housing surrounds the socket frame, the outer housing being conductive and providing electrical shielding for the socket connector and the paddle card.

20. A communication system comprising:
- a host circuit board having primary contacts at a primary mounting area and secondary contacts at a secondary mounting area in close proximity to the primary mounting area, the secondary contacts being electrically connected to the primary contacts by board traces;
- an electronic package coupled to the primary mounting area of the host circuit board, the electronic package having a substrate including package contacts and an electronic component on the substrate electrically connected to the package contacts, the substrate having a lower surface facing the host circuit board, the package contacts being electrically connected to the primary contacts; and
- a socket connector assembly coupled to the secondary mounting area of the host circuit board in close proximity to the electronic package, the socket connector assembly comprising:
- a socket connector mounted to a host circuit board proximate to the electronic package, the socket connector including a socket frame including an inner surface defining a socket opening and an outer surface defining a perimeter of the socket frame, a bottom of the socket frame mounted to the host circuit board, the socket connector including a socket substrate received in the socket opening and positioned in the socket opening by the inner surface, the socket substrate including lower socket conductors at a lower socket substrate surface of the socket substrate for electrical connection with the host circuit board, the socket substrate including upper socket contacts at an upper socket substrate surface of the socket substrate, each upper socket contact including a base terminated to the socket substrate, each upper socket contact including a deflectable spring beam extending from the base to a separable mating interface; and
- a cable assembly coupled to the socket connector, the cable assembly including an outer housing having a paddle card pocket open at a bottom of the outer housing, the outer housing having a first side wall at a first side of the paddle card pocket and a second side wall at a second side of the paddle card pocket, the cable assembly including a paddle card received in the paddle card pocket, the paddle card extending between a mating end and a cable end, the paddle card having an upper paddle card surface and a lower paddle card surface, the paddle card including paddle card contacts at the mating end on the lower paddle card surface interfacing with the separable mating interfaces of the upper socket contacts when the cable assembly is coupled to the socket connector, the cable assembly including cables terminated to the paddle card at the cable end of the paddle card, the cables being communicatively coupled to corresponding paddle card contacts, wherein the first and second side walls engage the outer surface of the socket frame to locate the paddle card relative to the socket substrate.

\* \* \* \* \*